United States Patent
Kern et al.

(10) Patent No.: US 9,196,320 B2
(45) Date of Patent: Nov. 24, 2015

(54) METHOD, APPARATUS AND DEVICE FOR DATA PROCESSING

(71) Applicant: Infineon Technologies AG, Neubiberg (DE)

(72) Inventors: Thomas Kern, Munich (DE); Mihail Jefremow, Augsburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/106,277

(22) Filed: Dec. 13, 2013

(65) Prior Publication Data

US 2015/0170717 A1   Jun. 18, 2015

(51) Int. Cl.
*G11C 7/00* (2006.01)

(52) U.S. Cl.
CPC .......................................... *G11C 7/00* (2013.01)

(58) Field of Classification Search
CPC ..................... G11C 13/0069; G11C 2013/009; G11C 2213/72; G11C 11/5628; G11C 11/5642; G11C 16/0483
USPC .............. 365/163, 185.03, 185.21, 52, 185.2, 365/207, 189.14, 51, 63
See application file for complete search history.

(56) References Cited

U.S. PATENT DOCUMENTS

2010/0232243 A1* 9/2010 Kobatake ....................... 365/207

OTHER PUBLICATIONS

Mihail Jefremow, et al.; "Bitline-Capacitance-Cancelation Sensing Scheme with 11ns Read Latency and Maximum Read Throughput of 2.9GB/s in 65nm Embedded Flash for Automotive"; ISSCC 2012, Session 25, Non-Volatile Memory Solutions, 25.4, IEEE 2012 International Solid-State Circuit Conference, p. 1-3.

Mihail Jefremow, et al.; "Bitline-Capacitance-Cancelation Sensing Scheme with 11 ns Read Latency and Maximum Read Throughput of 2.9GB/s in 65nm Embedded Flash for Automotive"; IEEE International Solid-State Circuits Conference; 2012 IEEE; p. 1-26.

* cited by examiner

*Primary Examiner* — Thong Q Le
(74) *Attorney, Agent, or Firm* — Eschweiler & Associates, LLC

(57) ABSTRACT

An embodiment relates to a method for data processing and comprises determining an electrical variable for each cell of a data bit, transforming each electrical variable into the time domain, and determining a blank state for at least one data bit based on a comparison of the transformed electrical variables.

21 Claims, 10 Drawing Sheets

METHOD, APPARATUS AND DEVICE FOR DATA PROCESSING

BACKGROUND OF THE DISCLOSURE

Embodiments of the present disclosure relate to a blank detection of data bits (with at least two cells per bit) of a memory with differential read.

SUMMARY

A first embodiment relates to a method for data processing comprising determining an electrical variable for each cell of a data bit, and transforming each electrical variable into the time domain. The method further comprises determining a blank state for at least one data bit based on a comparison of the transformed electrical variables.

A second embodiment relates to a device comprising a differential read memory, wherein each data bit is represented by a group of at least two memory cells, and wherein the at least two memory cells of this group are a true cell and a complementary cell. The device also comprises a current-to-voltage conversion stage configured to convert a current of the true cell to a voltage of the true cell and a current of the complement cell to a voltage of the complement cell, and a voltage-to-time conversion stage configured to convert the voltage of the true cell into a time domain signal of the true cell and the voltage of the complement cell into a time domain signal of the complement cell. The device further comprises a time comparator configured to determine a blank state of the data bit by comparing the time domain signal of the true cell with the time domain signal of the complement cell and comparing the time domain signal of the true cell and the time domain signal of the complement cell with a time domain reference signal.

A third embodiment relates to a device for data processing, in particular for determining a blank state of at least one data bit. The device comprises means for determining an electrical variable for each cell of a data bit, means for transforming each electrical variable into the time domain, and means for determining a blank state for at least one data bit based on a comparison of the transformed electrical variables.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

The introduction of a differential read in a non-volatile memory (NVM) improves reliability, e.g., even after a high number of write/erase cycles, but requires (at least) two NVM cells (also referred to as a cell pair) per data bit.

Hence, two associated NVM cells of a memory may store complementary information, i.e. they have opposite states. Only a bit that has complementary cell states can be successfully decoded, i.e. one of the two cells of a cell pair has to be in the written state and the other cell has to be in the erased state to allow for successful data decoding.

However, erasing of a page comprising several data bits, each represented by two memory cells results in a state with both cells being in the erased state, a so-called "blank state". Hence, after an erase operation, the data bit for this cell pair is not yet defined. Reading such a cell pair may result in an unpredictable result or it may even provide varying results for repeated read operations.

Therefore, in case a software reads a blank state, the result of such read operation is unpredictable. Hence, additional measures may be required for the software to determine whether or not the pair of cells is in such blank state.

The solution presented in particular solves the problem of how to detect the reading of a blank state, without losing the advantages of differential read and preventing significant area increase and complicated operations (current or voltage comparators) in the analog domain.

The solution described in particular refers to a reading operation (also referred to as "sensing") of two cells per bit architectures, e.g., array architectures or array structures, wherein the two cells are differential cells, i.e. one cell is regarded as the true cell and the other cell is regarded as the complement cell.

In a standard reading (sensing) mode the two cells may be compared with each other and the sign of the current difference may be encoded in one digital state "1" or "0". Before the actual read operation is conducted, the content of the memory portion is checked whether it contains valid data (i.e. complement data) or whether the cells are blank. Such a basic blank check can be achieved by comparing the two cells with a reference current or voltage. The blank check requires either additional analog circuitry in the sense amplifier which increases the current consumption and area or it requires additional read steps, which decrease the overall read performance of the system.

Figure 1:
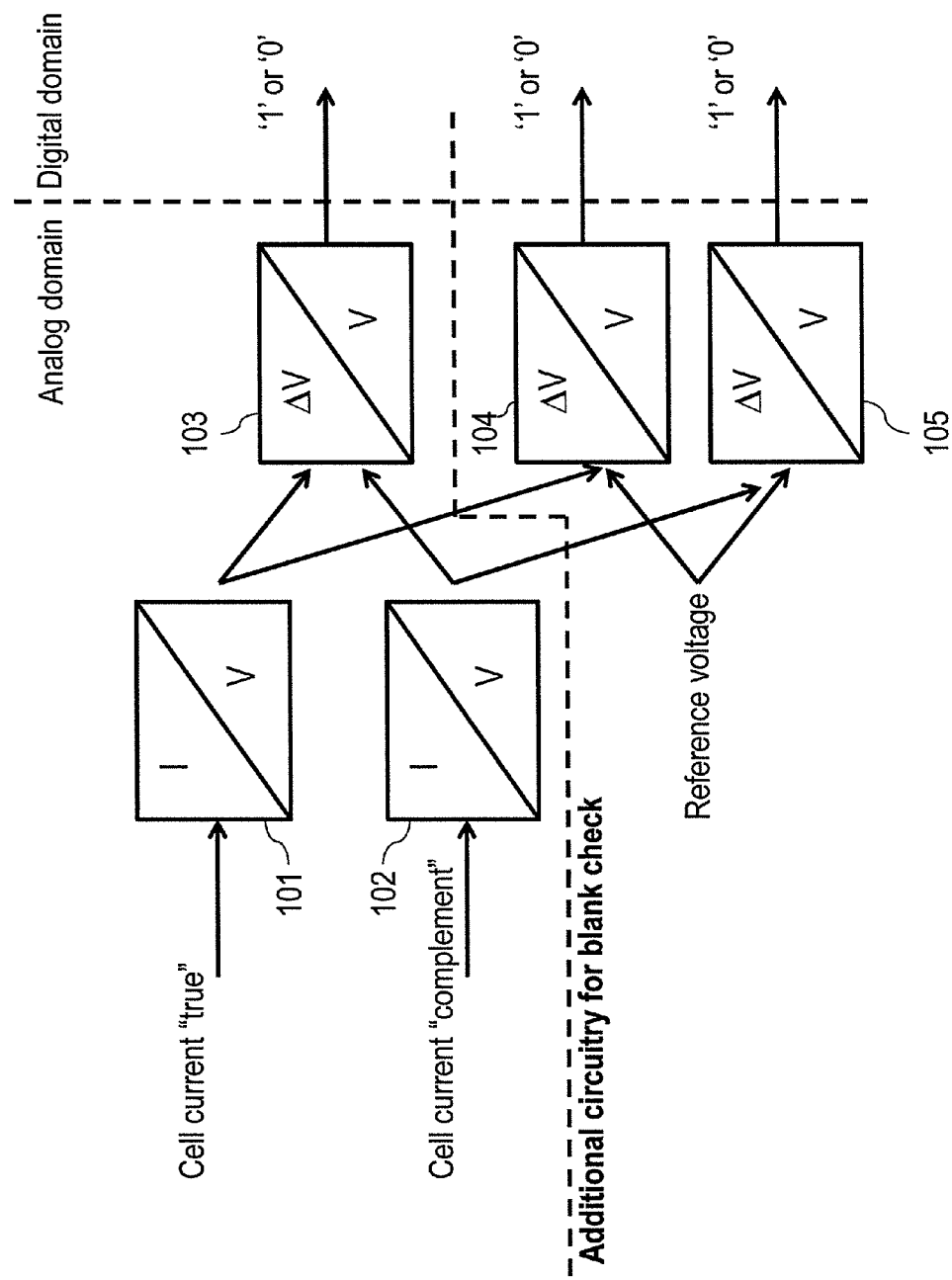
FIG. 1 shows a complement sensing scheme.

FIG. 1 shows a complement sensing scheme. A cell current of a true cell is converted into a voltage at a converter 101 and a cell current of a complement cell is converted into a voltage at a converter 102. The output of the converter 101 and the output of the converter 102 are fed to a differential (voltage) amplifier 103, which supplies a CMOS level signal "1" (VDD) or "0" (VSS) based on the voltage difference at its inputs. Hence, the converters 101, 102 and the amplifier 103 are part of an analog portion of a circuitry and the output supplied by the amplifier 103 can be further processed by a digital portion of the circuitry.

In order to enable a blank check, two additional amplifiers 104 and 105 are provided, wherein the output of the converter 101 is also fed to the amplifier 104 and the output of the converter 102 is also fed to the amplifier 105. Each of the amplifiers 104, 105 is further supplied with a reference voltage. The amplifier 104 determines whether the output of the true cell is below or above this reference voltage and accordingly supplies a CMOS level signal "1" or "0". The amplifier 105 determines whether the output of the complement cell is below or above this reference voltage and accordingly supplies a CMOS level signal "1" or "0". Based on this information it can be determined whether the complementary cells are in a valid logic state or in a blank state. For example, if an erased state is assigned a voltage greater than the reference voltage, a CMOS level of "0" on both cells would indicate a blank state.

The reference voltage may be based on a reference current.

The blank check mechanism described in FIG. 1 can be performed sequentially without the additional amplifiers 104 and 105. In a first step, the amplifier 103 is used to compare the output of the converter 101 (i.e. the true cell) with the reference voltage and in a second step the amplifier 103 is used to compare the output of the converter 102 (i.e. the complement cell) with the reference voltage.

Time domain sensing is described in 2012 IEEE International Solid-State Circuits Conference, ISSCC 2012/SESSION 25/NON-VOLATILE MEMORY SOLUTIONS/25.4, pages 428 to 430.

Figure 2:
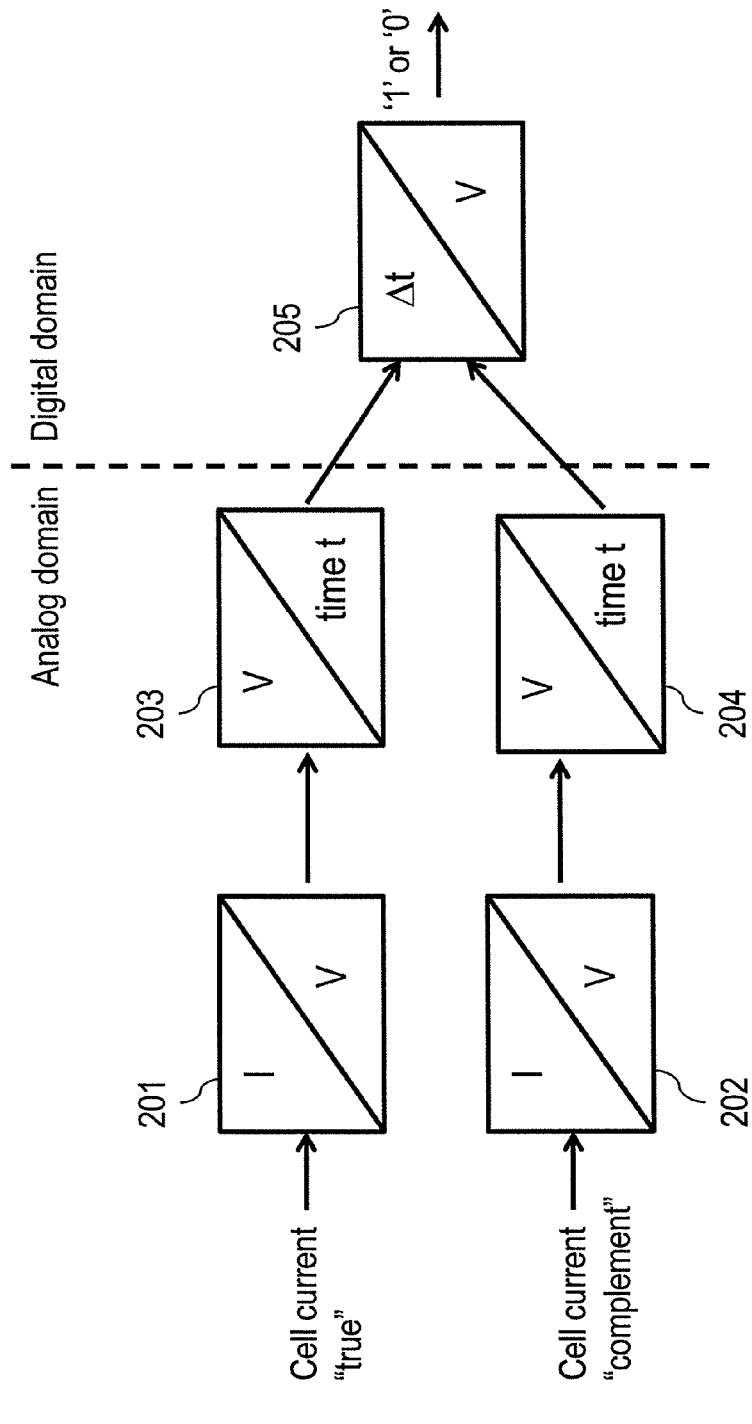
FIG. 2 shows an example diagram utilizing a time domain complement sensing scheme.

FIG. 2 shows an example diagram utilizing a time domain complement sensing scheme.

A cell current of a true cell is converted into a voltage at a converter 201. The output of the converter 201 is converted into a digital timing signal at a converter 203. A cell current of a complement cell is converted into a voltage at a converter 202. The output of the converter 202 is converted into a digital timing signal at a converter 204. The digital timing signals of converters 203 and 204 are conveyed to a time comparator 205 that compares the two timing informations and supplies a CMOS level signal "1" or "0" depending on the result of the time comparison ($\Delta t$).

Figure 3:
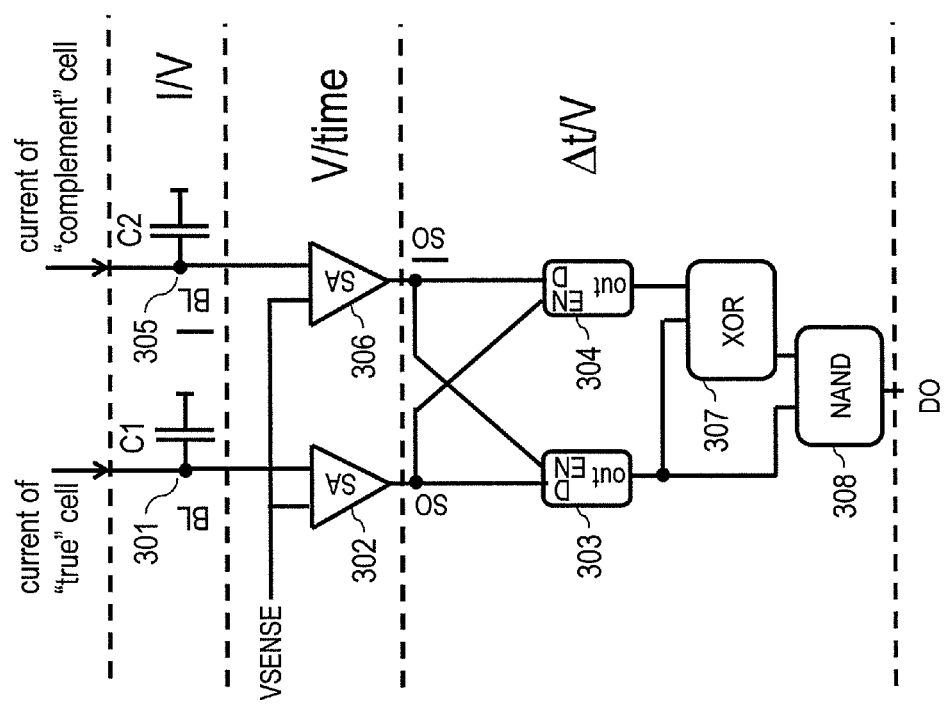
FIG. 3 shows an example circuitry based on the diagram of FIG. 2.

FIG. 3 shows an example circuitry based on the diagram of FIG. 2. In a current-to-voltage conversion stage, the current of the true cell is fed to a node 301, which is also connected via a capacitor C1 to ground. The node 301 is connected to the second input of a sense amplifier (SA) 302 of a voltage-to-time conversion stage. A reference voltage VSENSE is fed to the first input of the sense amplifier 302. The output of the sense amplifier 302 is connected to the input of the time comparator, i.e. to the input D of a latch 303 and to the input EN of a latch 304.

The current of the complement cell is fed to a node 305, which is also connected via a capacitor C2 to ground. The node 305 is connected to the second input of a sense amplifier 306 of the voltage-to-time conversion stage. The reference voltage VSENSE is fed to the first input of the sense amplifier 306. The output of the sense amplifier 306 is connected to the input the time comparator, i.e. to the input EN of the latch 303 and to the input D of the latch 304.

The input EN of the latch 303, 304 is referred to as an enable input. When the input EN is set to "1", the output of the respective latch remains unchanged regardless of its input D. If the input EN is set to "0", the output of the latch corresponds to its input D, it is operated in a so-called "transparent" mode.

The output of the latch 303 is connected to the first input of an XOR gate 307 and to the first input of a NAND gate 308. The output of the latch 304 is connected to the second input of the XOR gate 307. The output of the XOR gate is connected to the second input of the NAND gate 308. The output of the NAND gate 308 supplies a data out signal DO.

Figure 4A:
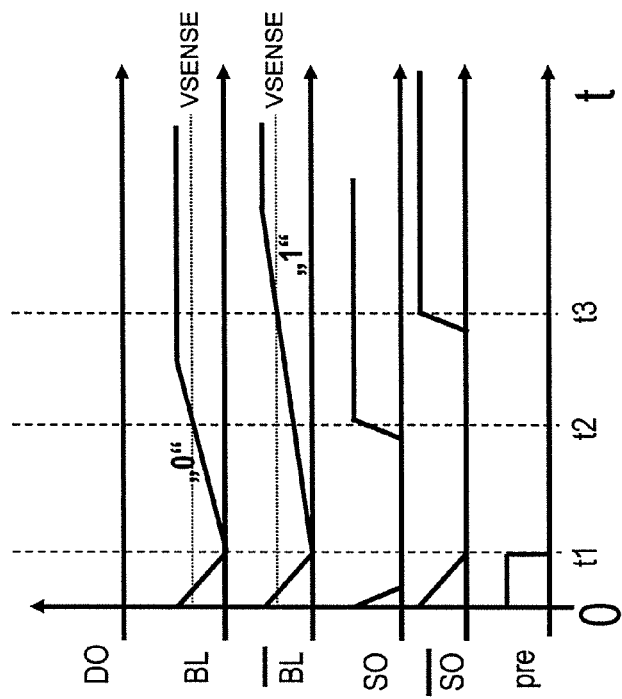
FIG. 4A and FIG. 4B each shows a timing diagram based on the circuitry as illustrated in FIG. 3.
Figure 4B:
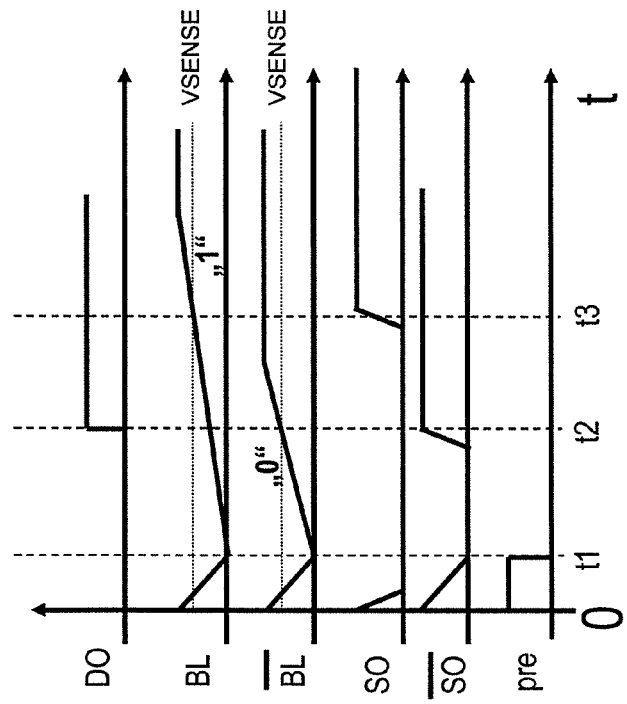

FIG. 4A and FIG. 4B each show a timing diagram based on the circuitry as illustrated in FIG. 3. The signal DO corresponds to the data out signal at the output of the NAND gate 308. The signal BL corresponds to the signal at the node 301 and the signal $\overline{BL}$ corresponds to the signal at the node 305. The signal SO corresponds to the signal at the output of the sense amplifier 302 and the signal $\overline{SO}$ corresponds to the signal at the output of the sense amplifier 306. The signal pre indicates an initial discharge prior to a time t1.

There are two cases with differential currents: Either the current of the true cell corresponds to logic "1" and the current of the complement cell corresponds to logic "0" or vice versa. According to the present example, in case a cell indicates logic "0", it carries a higher current compared to the case the cell indicating logic "1". Therefore, the signals BL and $\overline{BL}$ indicate a faster voltage slope for the logic "0" scenario. The faster slope is based on the integration of the higher cell current via the bitline capacitors C1 and C2.

According to the scenario shown in FIG. 4A, the true cell carries a current corresponding to logic "1" and the complement cell carries a current corresponding to logic "0", the BL voltage (at node 301) shows a lower slope than the signal $\overline{BL}$ (at the node 306). With the higher slope on $\overline{BL}$ the complement cell reaches the voltage threshold VSENSE prior to the true cell (voltage of the signal BL). Hence, at a time t2 when the signal $\overline{SO}$ changes from "0" to "1" the signal SO still remains "0", Hence, the output of the latch 303 indicates "0" and the output of the latch 304 indicates "1", which leads to "1" of the data out signal DO at the time t2. It is noted that the signal BL due to its lower slope (compared to the signal $\overline{BL}$) results in a transition from "0" to "1" at the output of the sense amplifier 302 at a time t3. This does not affect the output of the latch 303, because its enable input EN was set to "1" at the time t2. Also, the output of the latch 304 remains unchanged "1", which leads to an unchanged data out signal DO also at the time t3.

According to the scenario shown in FIG. 4B, the true cell carries a current corresponding to logic "0" and the complement cell carries a current corresponding to logic "1", the signal BL (at the node 301) shows a higher slope than the signal $\overline{BL}$ (at the node 306). With the higher slope on the signal BL the true cell reaches the voltage threshold VSENSE prior to the complement cell (voltage of the signal $\overline{BL}$). Hence, at a time t2 the signal SO changes from "0" to "1" and the signal $\overline{SO}$ remains at "0". Hence, the output of the latch 303 indicates "1" and the output of the latch 304 indicates "0", which leads to "0" of the data out signal DO at the time t2. It is noted that the signal $\overline{BL}$ due to its lower slope (compared to the signal BL) results in a transition from "0" to "1" at the output of the sense amplifier 306 at a time t3. This does not affect the output of the latch 304, because its enable input EN was already set to "1" at the time t2. Also, the output of the latch 303 remains unchanged "1", which leads to an unchanged data out signal DO also at the time t3.

Figure 5:
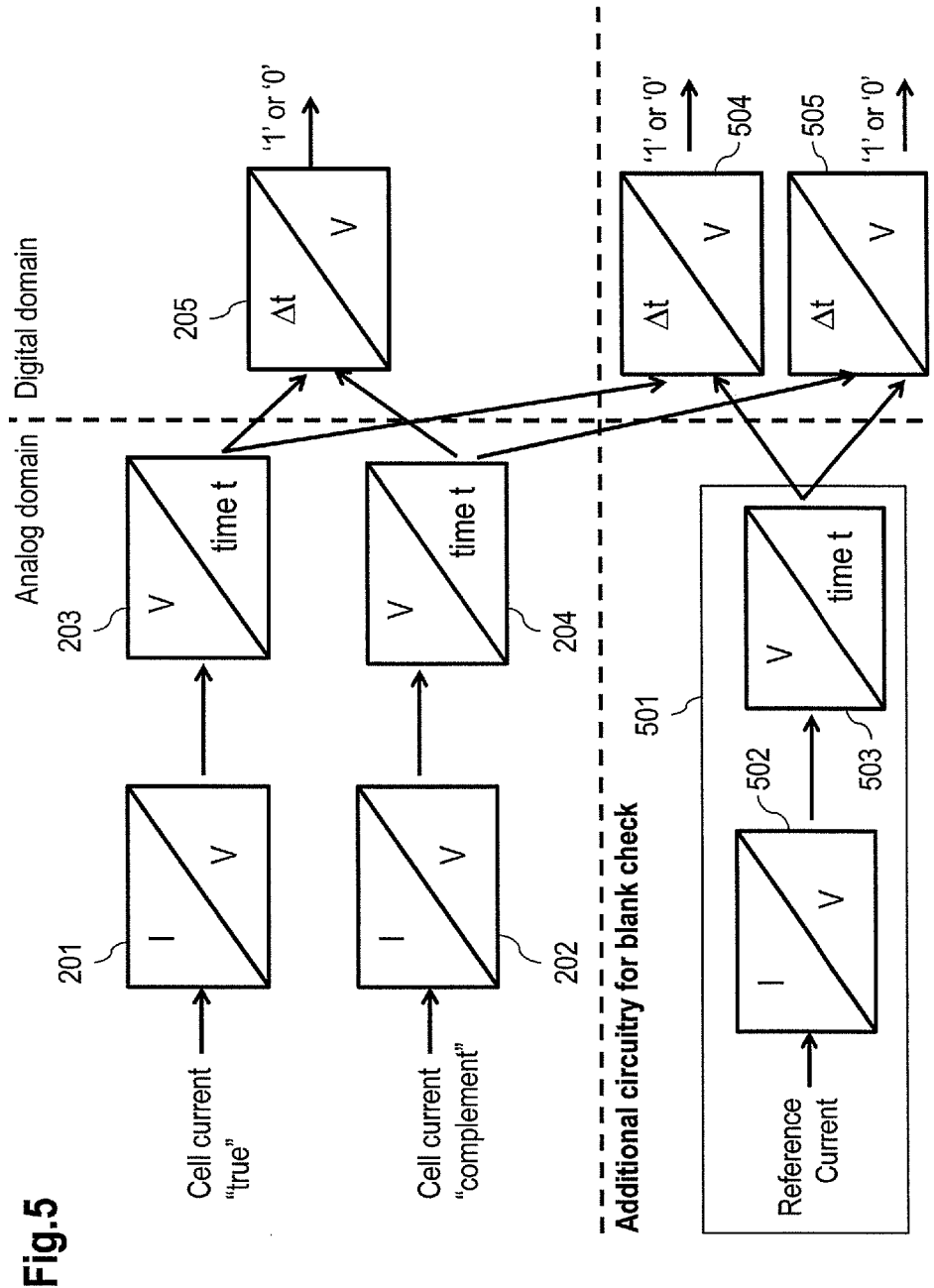
FIG. 5 shows a block diagram with a time domain complement sensing scheme including additional circuitry for blank detection.

FIG. 5 shows a block diagram with a time domain complement sensing scheme including additional circuitry for blank detection. FIG. 5 is based on the diagram shown in FIG. 2.

A global reference time generator 501 is provided comprising a reference current that is converted into a voltage at a converter 502. The output of the converter 502 is converted into a digital timing signal at a converter 503. The digital timing signal of the converter 503 is conveyed to a time comparator 504 and to a time comparator 505. Each of the time comparators 504, 505 supply a digital signal "1" or "0".

In addition, the output of the converter 203 is also fed to the time comparator 504 and the output of the converter 204 is also fed to the time comparator 505.

Figure 6:
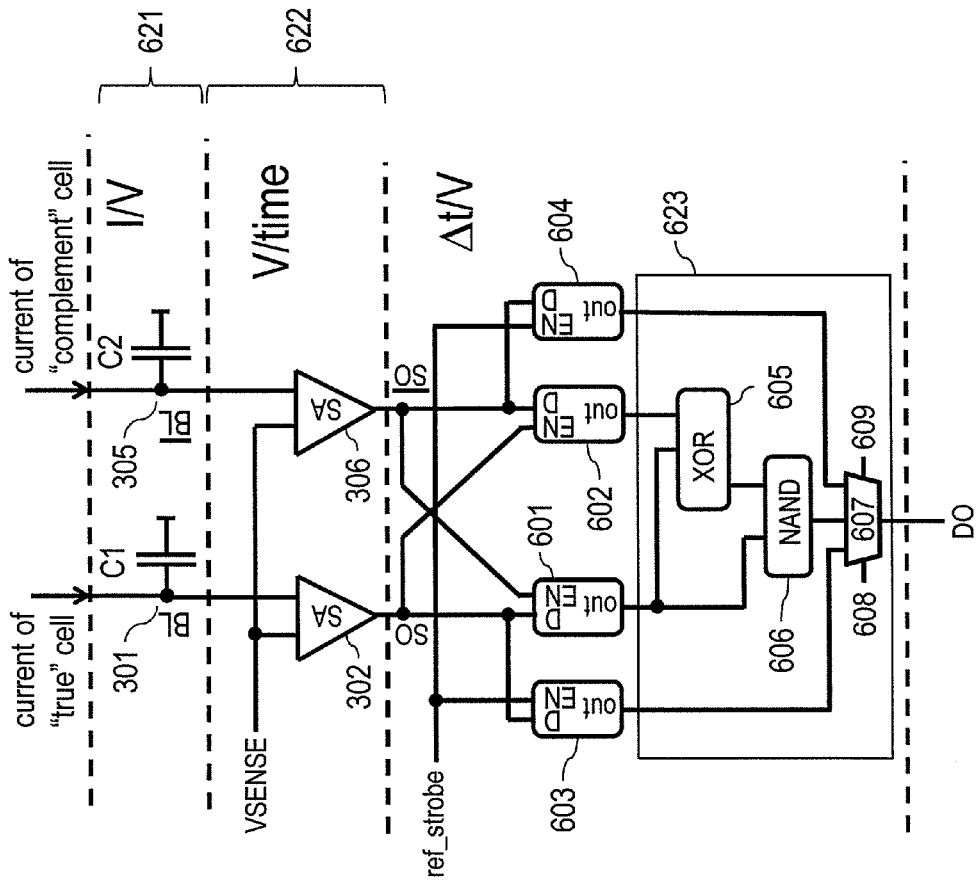
FIG. 6 shows an example circuitry based on the diagram of FIG. 5.

FIG. 6 shows an example circuitry based on the diagram of FIG. 5. A current-to-voltage stage 621 and a voltage-to-time stage 622 correspond to FIG. 3. The sense amplifier 302 supplies the signal SO and the sense amplifier 306 supplies the signal $\overline{SO}$. The output of the sense amplifier 302 is connected to the input D of a latch 601 and to the input EN of a latch 602. The output of the sense amplifier 306 is connected to the input EN of the latch 601 and to the input D of the latch 602.

The latches 601 to 604 are only one example implementation, which may be favorable due to reasons of symmetry. In addition, a single latch may be used as a timing comparator without any NAND or XOR gates.

An additional timing signal ref_strobe is provided, which may be based on a reference current and it can be used for blank detection purposes. The signal ref_strobe is connected to the input EN of a latch 603. The input D of the latch 603 is connected to the output of the sense amplifier 302. The signal ref_strobe is also connected to the input EN of a latch 604. The input D of the latch 604 is connected to the output of the sense amplifier 306.

Hence, dependent on the output signals at the sense amplifiers 302 and 306 the latches 601 and 602 are set as described above with regard to FIG. 3, FIG. 4A and FIG. 4B.

As also described above, the latches 601 to 604 are either in a transparent mode conveying its input signal D to the output (in case the EN input is set to "0") or it is locked to the previous input signal in case the EN input is set to "1". The latch 601 is associated with the output of the sense amplifier 302 and the latch 602 is associated with the output of the sense amplifier 306. Whichever output signal at the sense amplifiers 302 to 306 is the first to be "1" locks the latch 601, 602 for the respective other sense amplifier's output. This allows detecting "1" or "0" based on the complement cells as described above.

In addition, the latches 603 and 604 can be used to allow for a comparison of the currents in each of the differential cells with a predetermined threshold (via the signal ref_strobe). The signal ref_strobe is used to lock the latches 603 and 604 at a time determined on a reference current (see also FIG. 7). At that (reference) time which corresponds to a reference current, the latch 603 samples and locks the signal SO at the output of the sense amplifier 302 and the output of the latch 604 samples and locks the signal $\overline{SO}$ at the output of the sense amplifier 604. Hence, the respective cells are compared with a reference current in the time domain.

The outputs of the latches 601 to 604 can be further processed via different kinds of logic or they can be fed to a processing device for further evaluation.

FIG. 6 also shows an example logic 623 for further processing the outputs of the latches 601 to 604. An XOR gate 605 and a NAND gate 606 are connected to the outputs of the latches 601 and 602 as shown in and described with regard to FIG. 3. The output of the NAND gate 606 is fed to a multiplexer 607 together with the outputs of the latches 603 and 604. The multiplexer 607 can be controlled to supply the data out signal DO based on various control signals 608 and 609.

For example, the control signal 608 can be a "true/complement" signal. When the control signal 608 is set to "1", the complement output is multiplexed to the data out signal DO. If the signal 608 is set to "0", the output signals from the latches 603 and 604 are multiplexed to the data out signal DO, i.e. the respective cell currents of the true cell and the complement cell are compared with the global reference time signal ref_strobe. The signal 609 can be used to determine whether the output signal from the latch 603 or the output signal from the latch 604 is multiplexed to the data out signal DO.

Advantageously, only two additional latches 603 and 604 in the core voltage domain are required for blank checking purposes. Hence, only a limited additional area (for CMOS technologies) on the chip and only a small amount of additional power are required. The parallel conversion suggested allows for a fast sensing speed. The multiplexer allows switching between the complement and the respective comparison with the reference time signal to the data out signal DO. The solution presented can be easily extended due to its modular concept. For example, additional reference time signals can be utilized.

Figure 7:
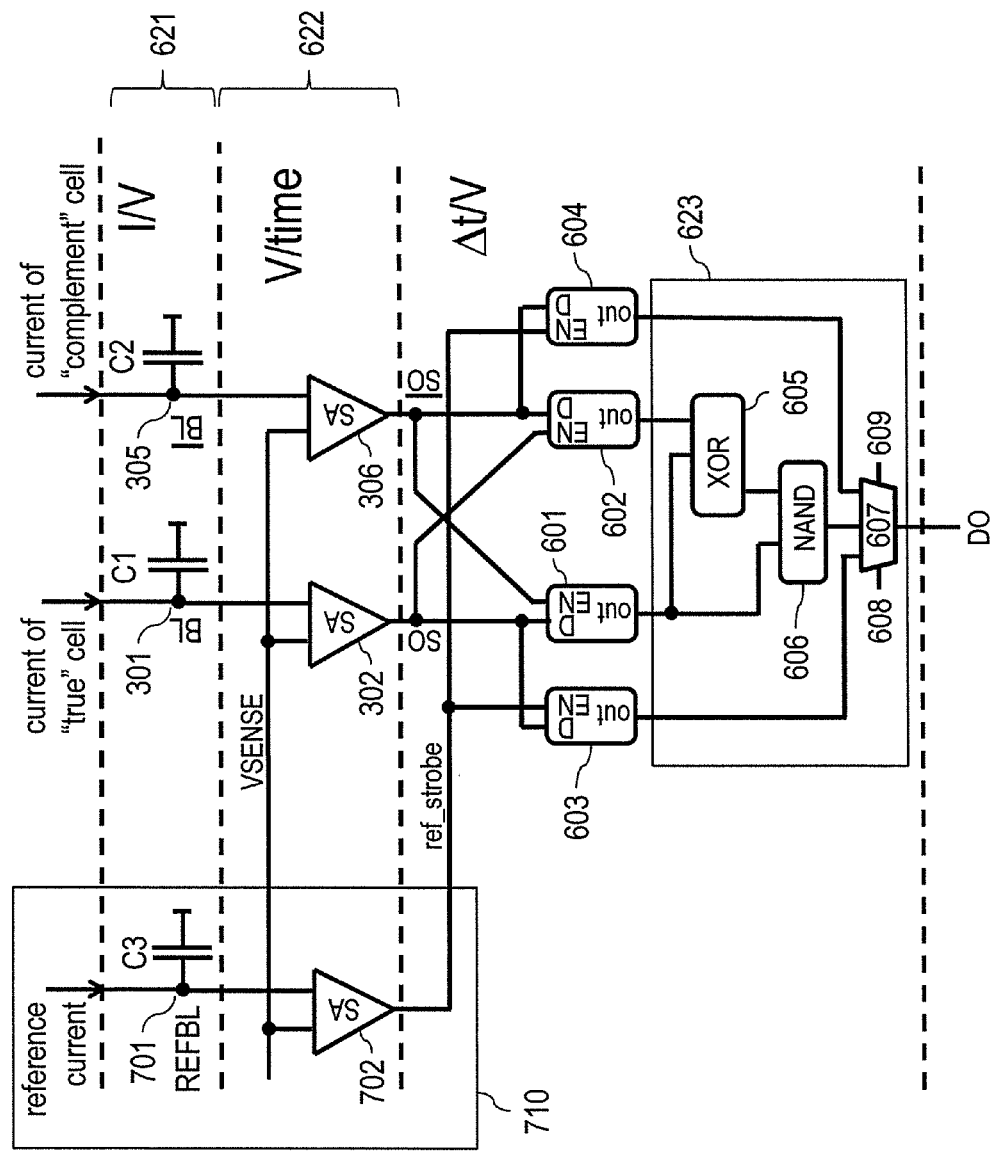
FIG. 7 shows an alternative circuitry based on the block diagram shown in FIG. 6 with a unit that visualizes how a reference current is converted into the reference signal (ref_strobe)

FIG. 7 shows an alternative circuitry based on the block diagram shown in FIG. 6 with a unit 710 that visualizes how a reference current is converted into the signal ref_strobe.

In a current-to-voltage conversion stage, the reference current is fed to a node 701, which is also connected via a capacitor C3 to ground. Advantageously, the capacitor C3 is (ideally) matched to the parasitic capacitors C1 and C2 and in one embodiment is generated by an extra reference bitline REFBL. The node 701 is connected to the second input of a sense amplifier 702 of a voltage-to-time conversion stage. The reference voltage VSENSE is fed to the first input of the sense amplifier 702. The output of the sense amplifier 702 supplies the signal ref_strobe.

Figure 8A:
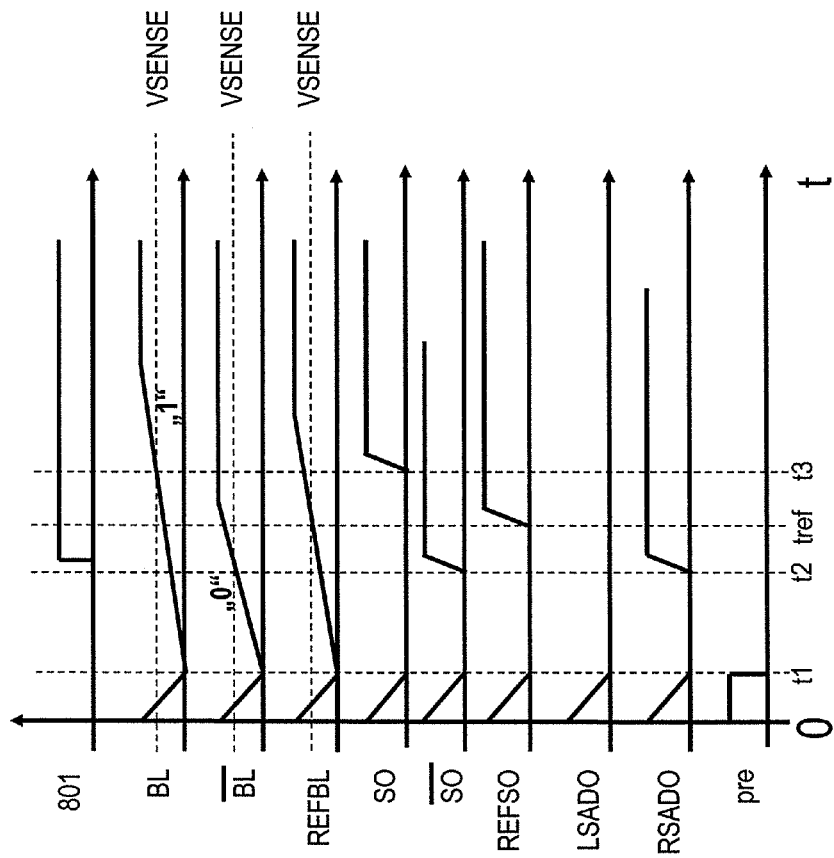
FIG. 8A, FIG. 8B and FIG. 8C each shows a timing diagram based on the circuitry as illustrated in FIG. 7.
Figure 8B:
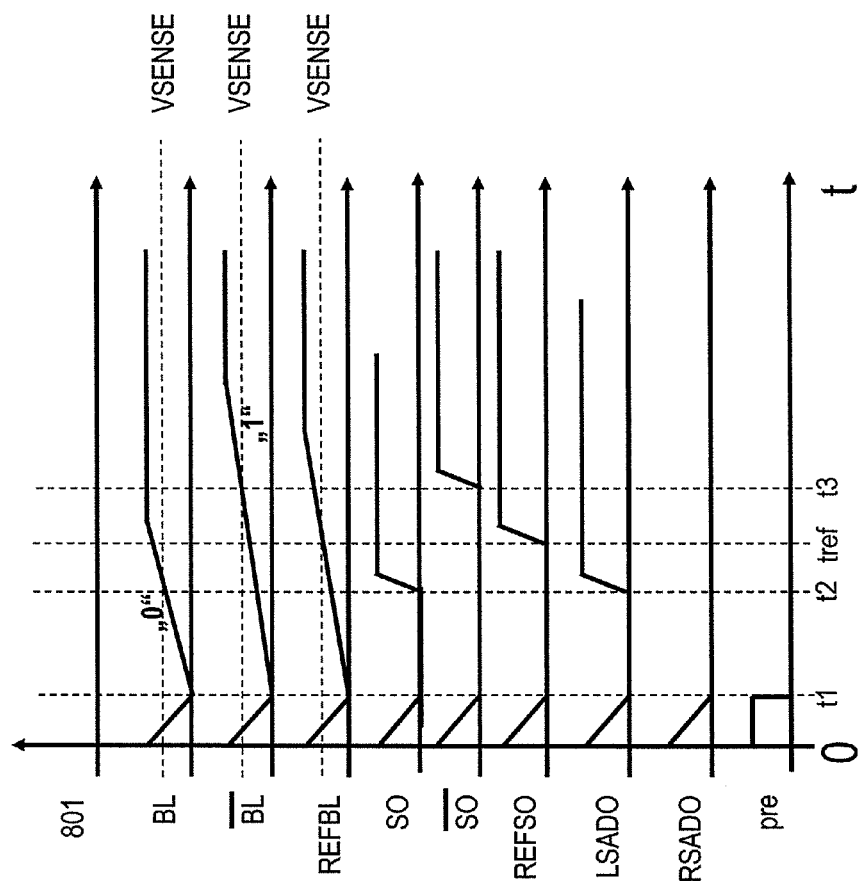

FIG. 8A and FIG. 8B each shows a timing diagram based on the circuitry as illustrated in FIG. 7. The signal 801 corresponds to the signal at the output of the NAND gate 606. The signal BL corresponds to the signal at the node 301 and the signal $\overline{BL}$ corresponds to the signal at the node 305. The signal at REFBL corresponds to the signal at the node 701. The signal SO corresponds to the signal at the output of the sense amplifier 302 and the signal $\overline{SO}$ corresponds to the signal at the output of the sense amplifier 306. The signal REFSO corresponds to the signal ref_strobe at the output of the sense amplifier 702. The signal LSADO corresponds to the signal at the output of the latch 603 and the signal RSADO corresponds to the signal at the output of the latch 604. The signal pre indicates an initial discharge prior to a time t1.

According to the scenario shown in FIG. 8A, the true cell carries a lower current corresponding to logic "1" and the complement cell carries a higher current corresponding to logic "0". Hence, the signal BL (at the node 301) shows a lower slope than the signal $\overline{BL}$ (at the node 306). This scenario corresponds to the case shown in and explained with regard to FIG. 4A.

According to the scenario shown in FIG. 8B, the true cell carries a higher current corresponding to logic "0" and the complement cell carries a lower current corresponding to logic "1", the signal BL (at the node 301) shows a higher gradient than the signal $\overline{BL}$ (at the node 306). This scenario corresponds to the case shown in and explained with regard to FIG. 4B.

At the time t2, the signal LSADO corresponds to the signal SO and the signal RSADO corresponds to the signal $\overline{SO}$. When the signal REFSO (ref_strobe) becomes "1" at a time tref, the latches 603 and 604 are locked in its previous state.

Hence, the time t2 corresponds to an integration time of the low resistive cell state "0" and the time t3 corresponds to an integration time of the high resistive cell state "1". The time tref corresponds to an integration time for the reference current.

Figure 8C:
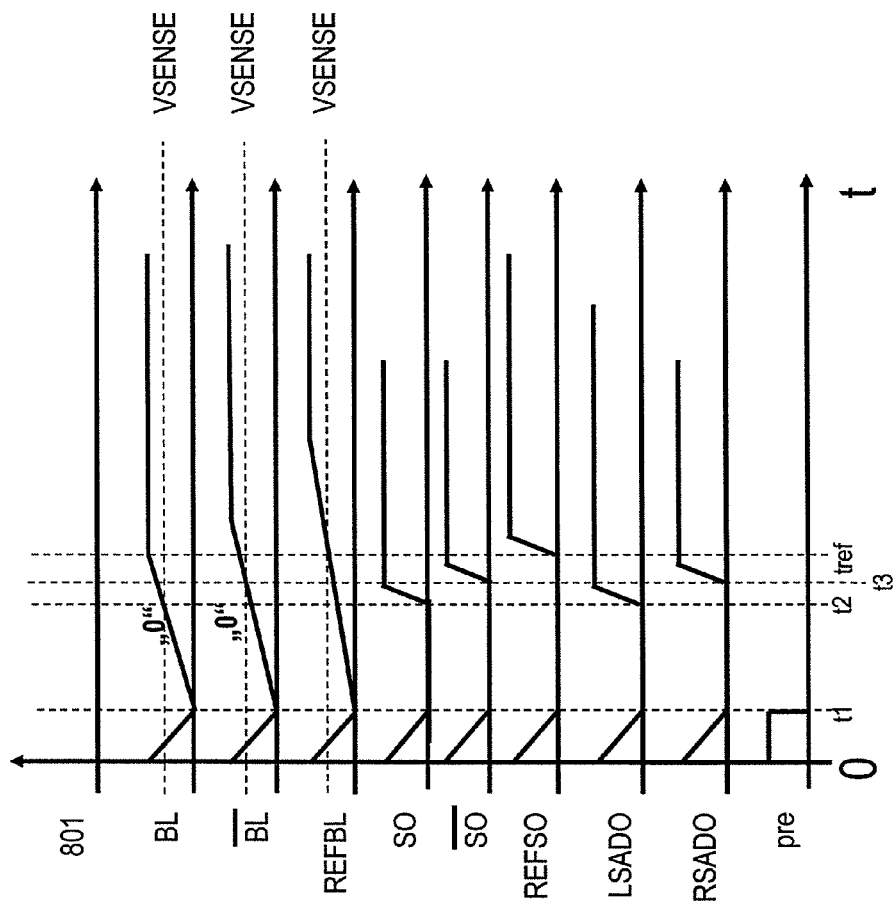

FIG. 8C shows an example timing diagram visualizing the detection of a blank cell. In this scenario, the time t2 (transition of signal SO from "0" to "1") and the time t3 (transition of signal $\overline{SO}$ from "0" to "1") happen prior to the time tref (when the signal REFSO becomes "1"). Hence, both signals LSADO and RSADO are "1" at the time tref. A switching between the complement mode (to detect the status of both complementary cells representing the data bit) and the single ended mode (detecting the status of each of the complementary cells in view of the reference current) may be conducted in particular after a program and/or erase operations.

Switching between the output of the NAND gate 606, LSADO and RSADO may be achieved via the multiplexer 607, hence the actual determination of the status of the differential cells may utilize three different but, e.g., parallel measurements supplied by the multiplexer to the output signal DO?

As an option, a parallel propagation of the three results for post processing may be utilized by, e.g., providing the output of the NAND gate 606 to a first control circuit and the signals LSADO and RSADO to a blank processing unit. Hence, such post-processing comprising the control circuit and the blank processing unit may decide whether the differential cells are blank or indicate "0" or "1" for a data bit.

The solution presented is in particular useable for various kinds of memory that may in particular have a read window of limited time, e.g., PCRAM (phase change RAM), CBRAM (conductive bridging RAM), MRAM (magneto resistive RAM).

The examples suggested herein may in particular be based on at least one of the following solutions. In particular combinations of the following features could be utilized in order to reach a desired result. The features of the method could be combined with any feature(s) of the device, apparatus or system or vice versa.

A method for data processing is provided, the method comprises determining an electrical variable for each cell of a data bit, transforming each electrical variable into the time domain, and determining a blank state for at least one data bit based on a comparison of the transformed electrical variables.

The electrical variable may be a current or a voltage associated with one data bit or with a cell of one data bit. The data bit may comprise two differential memory cells and the electrical variable may be a current or a voltage of the memory cell or associated with the memory cell. For example, a current of a true memory cell and a current of a complement memory cell may be determined as electrical variables. The respective current or a voltage derived from said current is transformed into the time domain, e.g., via integration. Hence, a time (or duration) may indicate the amount of the electrical variable, i.e. current or voltage.

The blank state can be determined for a single data bit (comprising at least two complementary memory cells) or for a larger number of data bits (e.g., a page or sector) of a (differential read) memory. The blank state can be determined by comparing the transformed electrical variables with a predetermined threshold (also transferred into the time domain), which may indicate that at least one of the electrical variables of complementary cells reaches and/or exceeds such threshold. Otherwise, the complementary cells may be in a blank state.

The various comparisons (i.e. true cell with complementary cell, true cell and complementary cells with reference variable) may be conducted in the time domain consecutively or (at least partially) in parallel. The comparisons may be controlled via a multiplexer.

The various comparisons may lead to a racing condition in the time domain. For example, the comparison between the true cell and the complement cell may be conducted in a way that the first logic "1" wins the race, e.g., by locking a latch of the respective other cell. The latch may be arranged within the path between the sense amplifier and the output. Another race condition may be defined by the timing based on the reference variable.

According to an embodiment, the electrical variable is a current, and the method comprises transforming the current into a voltage via an integration element, and comparing the voltage with a predetermined sense voltage.

The integration element may be a capacitor that is charged via said current and the charge of the capacitor corresponds to a voltage that is compared with the sense voltage. The comparison may be achieved via an operational amplifier (sense amplifier), which indicates at its output when the voltage reaches or exceeds the sense voltage. Dependent on the actual amount of current integrated, this indication occurs sooner or later, which allows to differentiate between logic "0" and "1" in the time domain.

In an embodiment, the blank state for a data bit is determined by comparing the transformed electrical variables with a reference variable that is also transformed into the time domain.

Hence, the reference variable supplies a reference time that can be used to determine whether differential cells fulfill the requirement of a blank state or in case the differential cells carry valid data (i.e. "0" or "1") for the data bit.

In an embodiment, the blank state is detected in case a first comparison of the transformed electrical variable of a true cell and a second comparison of the transformed electrical variable of a complement cell are both below the reference variable.

With the reference variable (e.g., current) transformed into the time domain an additional reference time is obtained that allows deciding whether the values of the true cell and the complement cell are "on the same side" of the reference variable: For example, if the current of the true cell and the current of the complement cell are both above the reference current, this is reflected in the time domain as well, because of the comparison with the (same) sense voltage. In such case, the data bit represented by the true cell and the complement cell is deemed to be in the blank state, because no differential signals (with regard to the reference current) can be detected. The reference current may be in or around the middle between the current of the true cell and the current of the complement cell.

It is noted that the first comparison and the second comparison are conducted after determining the state ("0" or "1") of the differential cells.

The reference signal can also be used to determine the situation that both cells are below the reference current, indicating for example invalidated data or accidental cell states which may be based on wrongful handling or aborted operations. Such unwanted situations may beneficially detected for safety reasons.

In an embodiment, the data bit comprises a true cell and a complementary cell, wherein the method comprises determining the state of the data bit based on the transformed electrical variables of the true cell and the complementary cell, and determining whether the data bit is in a blank state by conducting a first comparison of the transformed electrical variable of the true cell with the transformed reference variable, and a second comparison of the transformed electrical variable of the complement cell with the transformed reference variable. The blank state is determined in case the first comparison and the second comparison indicate that the electric variables of the true cell and the complement cell are above the reference variable and/or equal the reference variable.

In an embodiment, the state of the data bit is determined in a first act, the first comparison is conducted in a second act and the second comparison is conducted in a third act, wherein the first to third acts are controlled via a multiplexer.

In an embodiment, an invalidated state is detected in case a first comparison of the transformed electrical variable of a true cell and a second comparison of the transformed electrical variable of a complement cell are both below the reference variable.

It is also an option to indicate the invalidated state if the comparison reveals that the currents of the true cell and the complement cell are both above a reference variable (which may optionally be a different reference variable than the one used for the blank detection).

In an embodiment, the reference variable is based on a reference current or on a reference voltage.

In an embodiment, the reference variable is a reference current, wherein the method comprises transforming the reference current into a voltage via an integration element, and comparing the voltage with a predetermined sense voltage.

In an embodiment, each data bit is represented by a group of at least two memory cells, wherein at least two memory cells of this group are complementary cells of a differential read memory.

It is noted that complementary cells may comprise at least one true cell and at least one complementary cell.

In an embodiment, the memory cell is a memory cell of a non-volatile memory.

In an embodiment, the differential read memory comprises at least one of the following: floating gate cells, PCRAM, RRAM, MRAM, MONOS devices, nan crystal cells, and ROM.

A device is provided. The device comprises a differential read memory, wherein each data bit is represented by a group of at least two memory cells, and wherein the at least two memory cells of this group are a true cell and a complementary cell. The device also comprises a current-to-voltage conversion stage configured to convert a current of the true cell to a voltage of the true cell and a current of the complement cell to a voltage of the complement cell, and a voltage-to-time conversion stage configured to convert the voltage of the true cell into a time domain signal of the true cell and the voltage of the complement cell into a time domain signal of the complement cell. The device further comprises a time comparator for determining a blank state of the data bit by comparing the time domain signal of the true cell with the time domain signal of the complement cell.

In an embodiment, the time comparator is arranged for comparing the time domain signal of the true cell and the time domain signal of the complement cell with a time domain reference signal.

In an embodiment, the current-to-voltage conversion stage converts a reference current into a reference voltage, and the voltage-to-time conversion stage converts the reference voltage into the time domain reference signal.

In an embodiment, for each current signal the current-to-voltage conversion comprises an integrator and the voltage-to-time conversion stage comprises an amplifier that allows comparing the voltage supplied by the integrator with a sense voltage.

In an embodiment, the device is implemented on a single chip or die.

In an embodiment, the memory cell is a memory cell of a non-volatile memory.

In an embodiment, the differential read memory comprises at least one of the following: floating gate cells, PCRAM, RRAM, MRAM, MONOS devices, nan crystal cells, and ROM.

Also, a device for data processing is provided, in particular for determining a blank state of at least one data bit. The device comprises means for determining an electrical variable for each cell of a data bit, means for transforming each electrical variable into the time domain, and means for determining a blank state for at least one data bit based on a comparison of the transformed electrical variables.

In an embodiment, each data bit is represented by a group of at least two memory cells, wherein at least two memory cells of this group are complementary cells of a differential read memory.

Although various exemplary embodiments of the disclosure have been disclosed, it will be apparent to those skilled in the art that various changes and modifications can be made which will achieve some of the advantages of the disclosure without departing from the spirit and scope of the disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for data processing, comprising:
   determining an electrical variable for each cell of a data bit;
   transforming each electrical variable into the time domain; and
   determining a blank state for at least one data bit based on a comparison of the transformed electrical variables.

2. The method according to claim 1, wherein the electrical variable is a current, the method further comprising:
   transforming the current into a voltage via an integration element; and
   comparing the voltage with a predetermined sense voltage.

3. The method according to claim 1, wherein the blank state for a data bit is determined by comparing the transformed electrical variables with a reference variable that is also transformed into the time domain.

4. The method according to claim 3, wherein the blank state is detected in case a first comparison of the transformed electrical variable of a true cell of the data bit and a second comparison of the transformed electrical variable of a complement cell of the data bit are both below the reference variable.

5. The method according to claim 3, wherein the data bit comprises a true cell and a complementary cell, the method further comprising:
   determining the state of the data bit based on the transformed electrical variables of the true cell and the complementary cell; and
   determining whether the data bit is in a blank state by conducting a first comparison of the transformed electrical variable of the true cell with the transformed reference variable and a second comparison of the transformed electrical variable of the complement cell with the transformed reference variable, wherein the blank state is determined in case the first comparison and the second comparison indicate that the electric variables of the true cell and the complement cell are above the reference variable and/or equal to the reference variable.

6. The method according to claim 5, wherein the state of the data bit is determined in a first act, the first comparison is conducted in a second act and the second comparison is conducted in a third act, wherein the first to third acts are controlled via a multiplexer.

7. The method according to claim 3, wherein an invalidated state is detected in case a first comparison of the transformed electrical variable of a true cell and a second comparison of the transformed electrical variable of a complement cell are both below the reference variable.

8. The method according to claim 3, wherein the reference variable is based on a reference current or on a reference voltage.

9. The method according to claim 3, wherein the reference variable is a reference current, the method further comprising:
   transforming the reference current into a voltage via an integration element; and
   comparing the voltage with a predetermined sense voltage.

10. The method according to claim 1, wherein each data bit is represented by a group of at least two memory cells, wherein at least two memory cells of this group are complementary cells of a differential read memory.

11. The method according to claim 10, wherein the memory cell is a memory cell of a non-volatile memory.

12. The method according to claim 10, wherein the differential read memory comprises at least one of the following: floating gate cells, PCRAM, RRAM, MRAM, MONOS devices, nan crystal cells, and ROM.

13. A device, comprising:
   a differential read memory, wherein each data bit is represented by a group of at least two memory cells, wherein the at least two memory cells of this group are a true cell and a complementary cell;
   a current-to-voltage conversion stage configured to convert a current of the true cell to a voltage of the true cell and a current of the complement cell to a voltage of the complement cell;
   a voltage-to-time conversion stage configured to convert the voltage of the true cell into a time domain signal of the true cell and the voltage of the complement cell into a time domain signal of the complement cell; and
   a time comparator configured to determine a blank state of the data bit by comparing the time domain signal of the true cell with the time domain signal of the complement cell.

14. The device according to claim 13, wherein the time comparator is configured to compare the time domain signal of the true cell and the time domain signal of the complement cell with a time domain reference signal.

15. The device according to claim 13:
   wherein the current-to-voltage conversion stage is configured to convert a reference current into a reference voltage; and
   wherein the voltage-to-time conversion stage is configured to convert the reference voltage into the time domain reference signal.

16. The device according to claim 13, wherein for each current signal the current-to-voltage conversion comprises an integrator and the voltage-to-time conversion stage comprises an amplifier that is configured to compare the voltage supplied by the integrator with a sense voltage.

17. The device according to claim 13, wherein the device is implemented on a single chip or die.

18. The device according to claim 13, wherein the memory cell is a memory cell of a non-volatile memory.

19. The device according to claim 13, wherein the differential read memory comprises at least one of the following: floating gate cells, PCRAM, RRAM, MRAM, MONOS devices, nan crystal cells, and ROM.

20. A device for data processing, in particular for determining a blank state of at least one data bit, comprising:
   means for determining an electrical variable for each cell of a data bit;
   means for transforming each electrical variable into the time domain; and
   means for determining a blank state for at least one data bit based on a comparison of the transformed electrical variables.

21. The device according to claim 20, wherein each data bit is represented by a group of at least two memory cells, wherein at least two memory cells of this group are complementary cells of a differential read memory.

* * * * *